US010899603B2

(12) United States Patent
Boessendoerfer et al.

(10) Patent No.: US 10,899,603 B2
(45) Date of Patent: Jan. 26, 2021

(54) MICROMECHANICAL Z-INERTIAL SENSOR

(71) Applicant: Robert Bosch GmbH, Stuttgart (DE)

(72) Inventors: Ralf Boessendoerfer, Dinkelsbuehl (DE); Jan Waldmann, Reutlingen (DE); Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 207 days.

(21) Appl. No.: 16/178,716

(22) Filed: Nov. 2, 2018

(65) Prior Publication Data
US 2019/0135612 A1 May 9, 2019

(30) Foreign Application Priority Data

Nov. 9, 2017 (DE) .................. 10 2017 219 929

(51) Int. Cl.
*G01P 1/12* (2006.01)
*B81B 3/00* (2006.01)
*B81B 7/02* (2006.01)
*B81C 1/00* (2006.01)
*G01P 15/125* (2006.01)
*G01P 15/08* (2006.01)

(52) U.S. Cl.
CPC .............. *B81B 3/0043* (2013.01); *B81B 7/02* (2013.01); *B81C 1/00198* (2013.01); *G01P 15/125* (2013.01); *B81B 2201/0235* (2013.01); *G01P 2015/0831* (2013.01)

(58) Field of Classification Search
CPC . B81B 3/0043; B81B 7/02; B81B 2201/0235; B81C 1/00198; G01P 15/125; G01P 2015/0831; G01P 15/02; G01P 15/0032; G01P 2015/0808; G01P 2015/0811; G01P 2015/0817; G01P 2015/082; G01P 2015/0822; G01P 2015/0825; G01P 2015/0837; G01P 1/125
USPC .............. 73/514.24, 504.02–504.04, 504.12, 73/504.01, 504.16, 514.18, 514.21, 73/514.23, 514.29, 514.32–514.34
See application file for complete search history.

(56) References Cited

U.S. PATENT DOCUMENTS

| | | | |
|---|---|---|---|
| 2007/0070481 A1 | 3/2007 | Nishikawa et al. | |
| 2012/0119425 A1 | 5/2012 | Gutierrez et al. | |
| 2014/0144232 A1* | 5/2014 | Lin ...................... | B81B 3/0051 73/504.12 |

FOREIGN PATENT DOCUMENTS

| | | |
|---|---|---|
| DE | 19941045 A1 | 4/2001 |
| DE | 112005003758 A5 | 8/2008 |
| DE | 102010039069 A1 | 2/2012 |
| DE | 102013216915 A1 | 2/2015 |
| DE | 102013222747 A1 | 5/2015 |
| EP | 2201421 A1 | 6/2010 |

* cited by examiner

*Primary Examiner* — Robert R Raevis
(74) *Attorney, Agent, or Firm* — Norton Rose Fulbright US LLP; Gerard Messina

(57) ABSTRACT

A micromechanical z-inertial sensor, having a movable MEMS structure developed in a micromechanical function layer; a torsion spring connected to the movable MEMS structure; and a spring device connected to the torsion spring, the spring device being developed to hamper a deflection of the torsion spring orthogonal to a sensing direction of the MEMS structure in a defined manner.

10 Claims, 5 Drawing Sheets

MICROMECHANICAL Z-INERTIAL SENSOR

CROSS REFERENCE

The present application claims the benefit under 35 U.S.C. § 119 of German Patent Application No. DE 102017219929.6 filed on Nov. 9, 2017, which is expressly incorporated herein by reference in its entirety.

FIELD

The present invention relates to a micromechanical z-inertial sensor. In addition, the present invention relates to a method for producing a micromechanical z-inertial sensor.

BACKGROUND INFORMATION

Micromechanical z-inertial sensors having MEMS structures have been known for a long time. They may have a rocker structure which is developed in a function layer and is attached to the substrate with the aid of torsion springs. As a rule, the mass distribution of the rocker structure has an asymmetrical development, and two electrode surfaces are situated below the rocker so that the deflection of the rocker structure is able to be measured in a capacitive manner. One disadvantage of this system is that the asymmetrical mass suspended at the torsion springs reacts not just to an acceleration in the z-direction.

SUMMARY

It is an object of the present invention to provide a micromechanical z-inertial sensor which exhibits an improved sensing behavior.

According to a first aspect of the present invention, the object may be achieved by a micromechanical z-inertial sensor, which has
- a movable MEMS structure, which is developed in a micromechanical function layer;
- a torsion spring, which is connected to the movable MEMS structure; and
- a spring device, which is connected to the torsion spring, the spring device being developed to hamper a deflection of the torsion spring orthogonal to a sensing direction of the MEMS structure in a defined manner.

In this way, a stiffening of the torsion spring in a direction orthogonal to the sensing direction (e.g., in the x-direction) is advantageously achieved, while a softness of the torsion spring in the z-direction is obtained at the same time. This ultimately contributes to an improved sensing behavior of the z-inertial sensor.

According to a second aspect of the present invention, the objective is achieved by a method for producing a micromechanical z-inertial sensor, the method having the following steps:
- Providing a movable MEMS structure developed in a micromechanical function layer;
- Providing a torsion spring which is connected to the movable MEMS structure; and
- Providing a spring device, which is connected to the torsion spring in such a way that a deflection of the torsion spring orthogonal to a sensing direction of the MEMS structure is able to be hampered in a defined manner.

Preferred further developments of the micromechanical z-inertial sensor are the subject matter of the dependent claims.

One advantageous further refinement of the micromechanical z-inertial sensor in accordance with the present invention is characterized in that a height of the spring device amounts to approximately one-third, and more preferably approximately to one-tenth of a height of the torsion spring. In this way, advantageous geometrical dimensions are provided for the spring device, and a suitable configuration, e.g., using known simulation methods, is able to be realized.

Another advantageous further refinement of the micromechanical z-inertial sensor in accordance with the present invention is characterized in that the spring device is fixed in place on a substrate. This results in a stable positioning of the spring device within the z-inertial sensor, and the connection to the substrate is able to be implemented directly or with the aid of an auxiliary structure.

Another advantageous further refinement of the micromechanical z-inertial sensor is characterized in that the spring device is at least partly situated below the movable MEMS structure. This advantageously contributes to a compact, resource- and space-sparing construction of the z-inertial sensor.

Another advantageous further refinement of the micromechanical z-inertial sensor is characterized in that the spring device is developed in a layer that is formed between the substrate and the micromechanical function layer. This allow for multiple uses of a layer as a spring layer and as an electrode layer.

Another advantageous further refinement of the micromechanical z-inertial sensor is characterized in that the spring device is at least partly developed above the micromechanical function layer. This advantageously realizes an alternative development of the spring device.

Another advantageous further refinement of the micromechanical z-inertial sensor is characterized in that one end of the torsion spring is connected to a part of the spring device that is essentially developed above the micromechanical function layer, and another end of the torsion spring is connected to a part of the spring device that is developed essentially below the micromechanical function layer. This makes it possible to realize an even better decoupling of the z-inertial sensor with regard to transverse loading, and tilting movements of the torsion spring, in particular, are able to be suppressed in an even more optimal manner.

Another advantageous further refinement of the micromechanical z-inertial sensor is characterized in that the spring device has sections that have an orthogonal alignment relative to one another. In an advantageous manner, due to the large spring length, a deflection of the torsion spring may thus take place quite easily, yet the torsion spring is simultaneously hard in a direction orthogonal to the sensing direction (e.g., in the x-direction). In addition, this variant allows also for space-saving realizations of the z-inertial sensor.

Another advantageous further refinement of the micromechanical z-inertial sensor is characterized in that at least one element of the spring device has a reinforcement structure. This advantageously allows for an even further improvement in the stability and stiffness of the spring device.

Below, the present invention will be described in detail with the aid of a plurality of figures. Identical or functionally equivalent elements have been provided with the same reference numerals. The figures are particularly meant to illustrate the salient principles of the present invention and are not necessarily drawn true to scale. For better clarity, it may be the case that not all reference numerals are shown in all of the figures.

Disclosed method features similarly result from correspondingly disclosed device features, and vice versa. This especially means that features, technical advantages and embodiments with regard to the method for producing a micromechanical z-inertial sensor result in a similar manner from corresponding embodiments, features and advantages with regard to the micromechanical z-inertial sensor, and vice versa.

DETAILED DESCRIPTION OF EXAMPLE EMBODIMENTS

In accordance with the present invention, a "micromechanical auxiliary construction" is provided, with the aid of which lateral rotatory and translatory movements of a z-inertial sensor including a rocker, in particular a z-acceleration sensor, are made stiffer. Using the mentioned micromechanical auxiliary construction, which will be described in more detail below, lateral movements of the seismic mass of the z-inertial sensor are hampered or stiffened in a defined manner.

Figure 1:
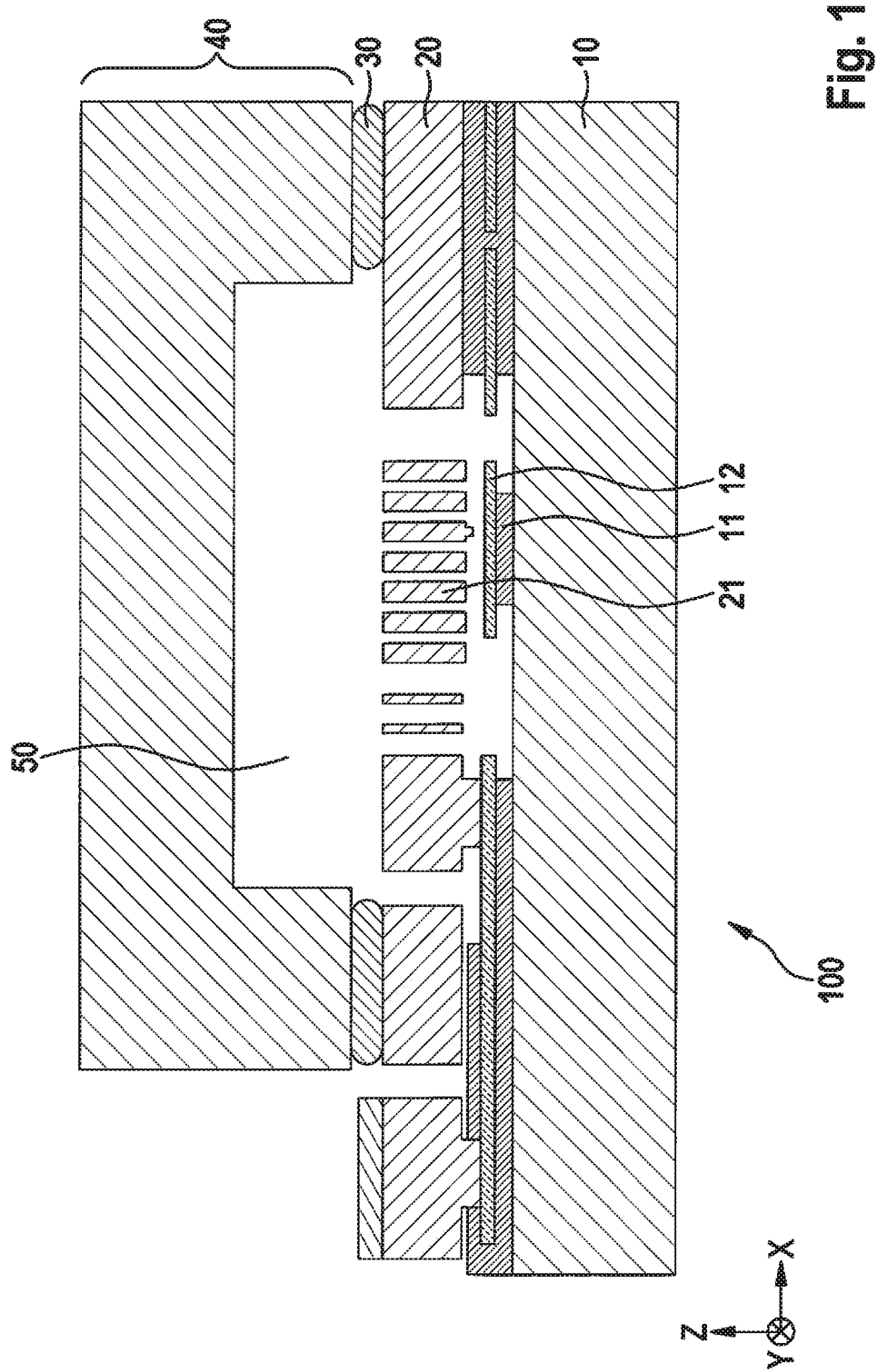
FIG. 1 shows a cross-sectional view of a conventional micromechanical inertial sensor.

FIG. 1 illustrates that movable MEMS structures 21, which are etched out of a thick micromechanical function layer 20 made of polysilicon, are often provided in acceleration sensors. They are placed above thin, buried polysilicon layers 12, which in turn are attached to a substrate 10 by an oxide layer 11. An oxide layer is also provided between the two polysilicon layers 12, 20.

Buried polysilicon layer 12 is used as an electric circuit trace and/or as an electrode. Micromechanical function layer 20 is exposed via a trenching process and an oxide sacrificial layer method. Buried polysilicon layer 12 is electrically separated from substrate 10 via an oxide 11. The circuit traces and electrodes have a width such that they are not fully undercut during the oxide sacrificial oxide etching step and are thus attached to substrate 10 in a stable manner.

In most cases, movable MEMS structures 21 ("seismic mass") produced in such a manner are sealed by a cap wafer 40 during the further process sequence. Depending on the use, a suitable internal pressure is enclosed within volume 50 sealed in this manner, the seal in most cases being implemented via a seal-glass bonding method or via a eutectic bonding method, e.g., using AlGe.

Figure 2:
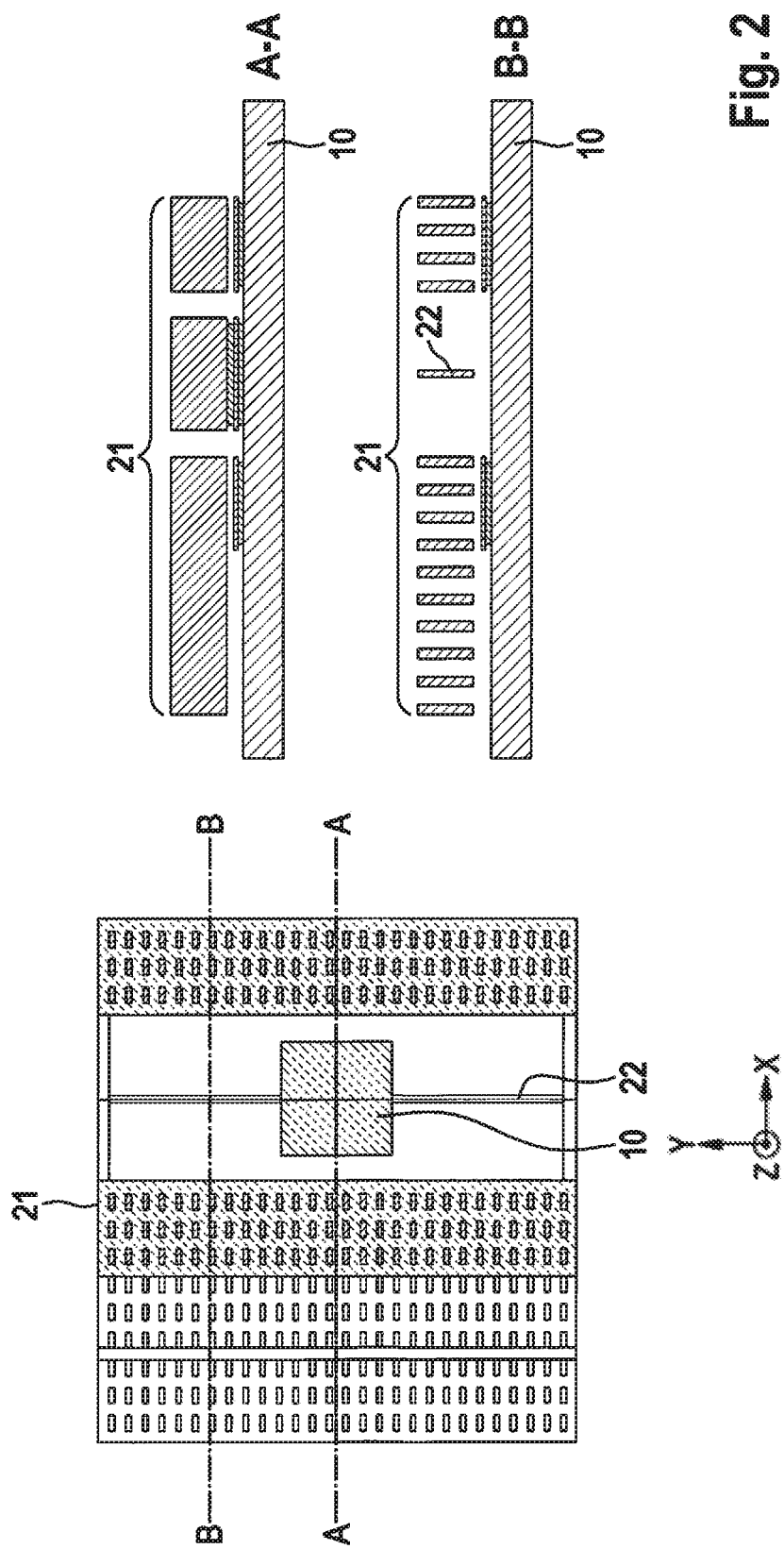
FIG. 2 shows views of a conventional micromechanical z-inertial sensor.

In order to produce a z-acceleration sensor during such a production process, a rocker structure is developed in micromechanical function layer 20, which is attached to substrate 10 via torsion springs 22, as sketched in FIG. 2. The mass distribution of the rocker structure has an asymmetrical development, and two electrode surfaces are placed below the rocker structure in order to detect a deflection of the rocker structure in a capacitive manner with the aid of measuring technology.

One disadvantage of this system may be that the asymmetrical mass suspended at torsion springs 22 is sensitive not just to a mechanical acceleration in the z-direction. If a mechanical acceleration in the x-direction is applied, then the asymmetrical mass is deflected to virtually the same degree also in the x-direction. If an acceleration in the y-direction is present, then the asymmetrical mass is rotated about the z-axis of rotation. This rotation, too, has a similar order of magnitude at the same absolute acceleration. As a result, this type of suspension of an asymmetrical mass may be utilized for producing an acceleration sensor that is sensitive in three directions and has only one movable mass.

A disadvantage of such systems is a relatively low precision of a sensor of this type. If a very precise measurement of the acceleration in one direction is desired, then sensors are normally constructed that are sensitive in only a single direction. In the x- and y-directions, movable mass-spring systems are able to be constructed in the aforementioned related art, which are suspended in a soft manner in the detection direction and in a hard manner in the directions perpendicular thereto.

In this manner, highly precise sensors are able to be constructed that exhibit high precision and will also not be affected by signals in a direction perpendicular to the detection direction. Many additional interfering effects by a movement in a non-measuring direction are also easily able to be suppressed with the aid of such suspensions.

In particular, it is possible to provide stops for the movable mass in the measuring direction in a well-defined manner. These make it possible to construct systems that are mechanically very robust with regard to overloading and an adhesion tendency.

In contrast, in z-sensors, it is difficult to build a torsion spring using a thick polysilicon layer function layer, which, as described earlier in this text, is able to be patterned only by a trenching process, the torsion spring being soft with regard to torsion on the one hand yet simultaneously hard with regard to a deflection in the x-direction or a rotation in the z-direction.

Figure 3:
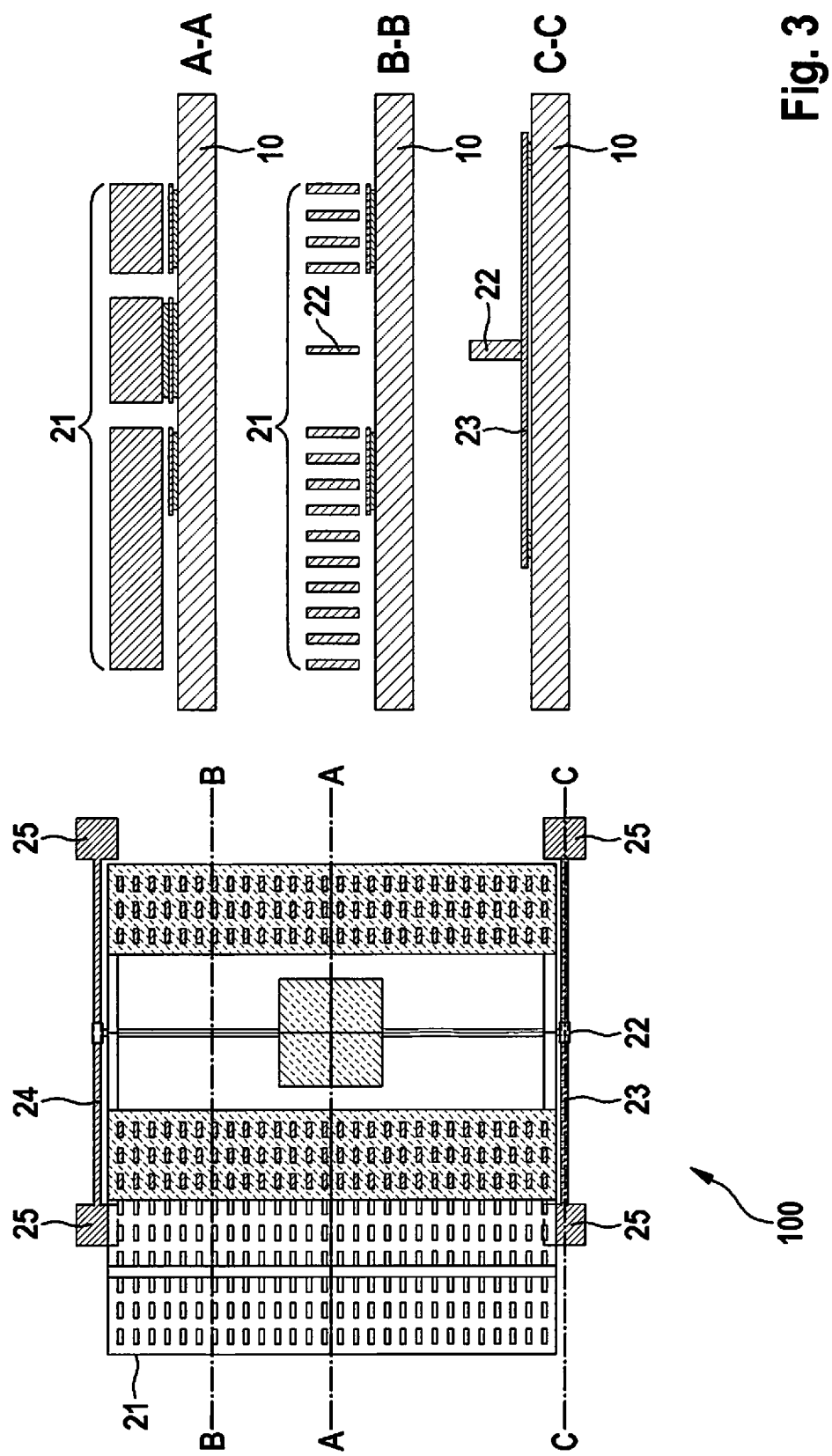
FIG. 3 shows views of a first specific embodiment of a provided micromechanical z-inertial sensor.

FIG. 3 shows a plan view and three sectional views through a specific embodiment of a provided micromechanical z-inertial sensor 100. Shown are three considerably simplified sectional views through the sectional planes A-A, B-B and C-C. It can be gathered that torsion spring 22 is now mechanically attached to stiffening spring elements 23, 24, spring elements 23, 24 being connected to substrate 10 with the aid of attachment elements 25. Because of the attachment of torsion spring 22 to stiffening spring elements 23, 24, a movement of torsion spring 22 in the x-direction is hampered, but at the same time, an elasticity of torsion spring 22 in the z-direction is still present.

Depending on the configuration of spring elements 23, 24, this advantageously makes it more difficult or hampers the deflection of torsion spring 22 perpendicular to the torsion axis in the x-direction in a defined manner. Spring elements 23, 24 have a height in the z-direction that amounts in a specified manner to less than one-half of the maximum height, preferably to approximately one-third, and most preferably, to approximately one-tenth of the height of torsion spring 22.

Spring elements 23, 24 are preferably fixed in place in the vicinity of the torsion axis on torsion spring 22 or on the exposed seismic mass. The attachment of spring elements 23, 24 to substrate 10 is accomplished with the aid of attachment elements 25. In this way the spring stiffness perpendicular to the substrate plane is low, but the lateral stiffness (in the substrate plane) is high.

In one specific embodiment, which is not shown in the figures, it may be provided to place spring elements 23, 24 in such a way that they are at least partly or also completely situated below movable MEMS structure 21, which makes it easier to achieve a space-saving construction of the micromechanical z-inertial sensor.

Figure 4:
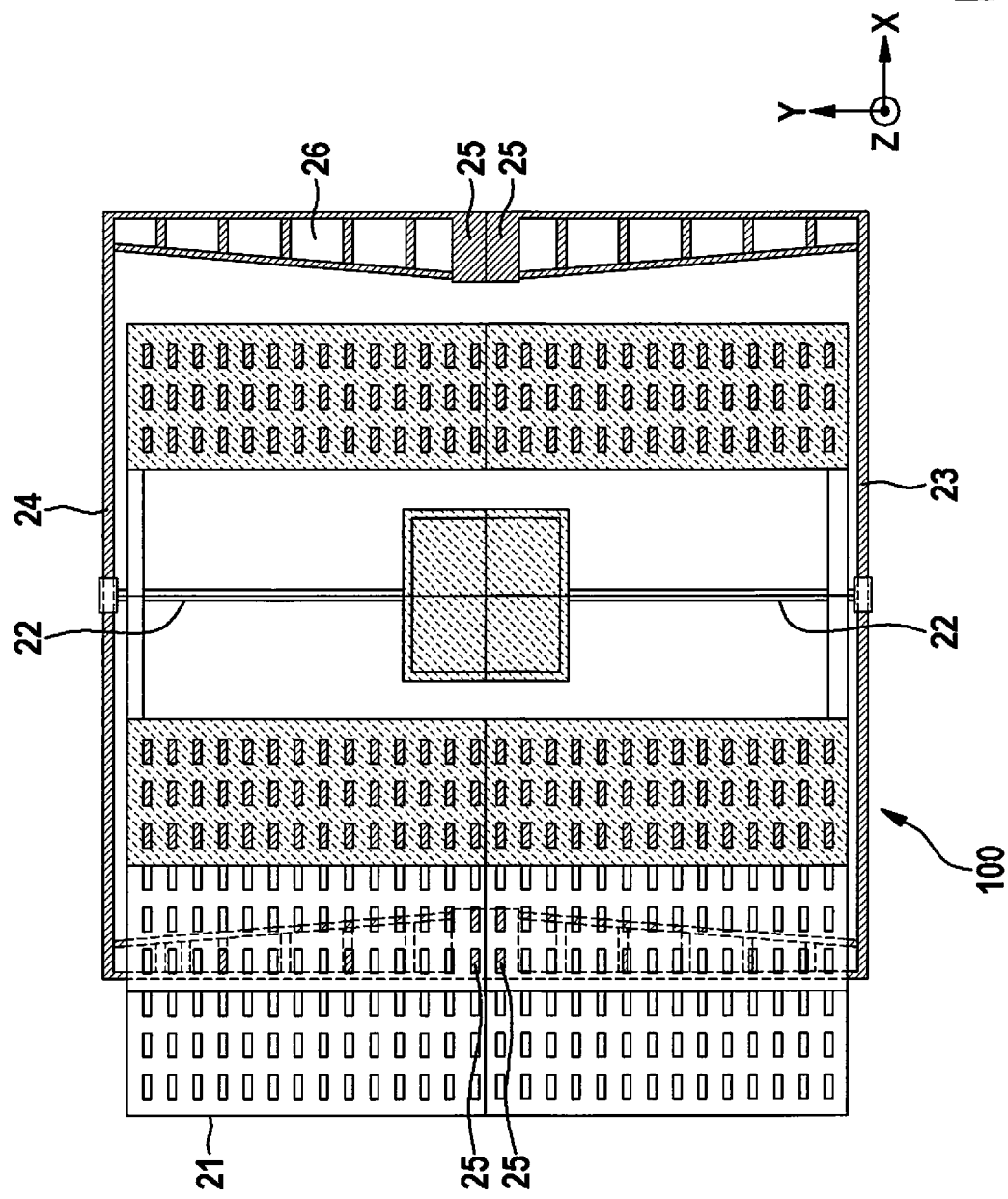
FIG. 4 shows a plan view of a further specific embodiment of a provided micromechanical z-inertial sensor.

FIG. 4 shows a plan view of a further specific embodiment of the provided micromechanical z-inertial sensor 100. In this variant, which may preferably be used in very small and sensitive z-sensors, spring elements 23, 24 are developed with sections that have an orthogonal development relative to one another. Mentioned spring elements 23, 24 are centrally attached to substrate 10 with the aid of attachment elements 25.

In terms of geometry, very long spring elements 23, 24 are realized in this manner, which provide an even greater elasticity of torsion spring 22 in the z-direction. This ultimately provides a stiffening of torsion spring 22 in the x-direction with an improved elasticity in the z-direction.

In the variant of micromechanical z-inertial sensor 100 including spring elements 23, 24 shown in FIG. 4, it may furthermore be gathered that they include checkered reinforcement structures 26. However, it is of course understood that these are merely of an exemplary nature and that different reinforcement structures 26 within spring elements 23, 24 are possible as well, which, for instance, may be developed in a meander shape or in a planar, rounded etc. form (not shown).

Stiffening spring elements 23, 24 are preferably developed in a polysilicon layer 12 between substrate 10 and thick micromechanical function layer 20. Preferably, the stationary counter-electrodes are produced in the same plane, which allows for an efficient resource utilization for the production of the provided micromechanical z-inertial sensor.

In one further specific embodiment of micromechanical z-inertial sensor 100, which is not shown in the figures, spring elements 23, 24 may also be developed above thick micromechanical function layer 20.

Another variant of spring elements 23, 24 provides that they are attached on different sides of torsion spring 22. For example, it may be provided to attach spring element 23 at an underside of torsion spring 22 and to attach spring element 24 at an upper side of torsion spring 22. In this way spring elements 23, 24 come to lie at the level of the center of gravity of the rocker with regard to the z-axis of the rocker. This may be achieved in that spring elements 23, 24 are produced above and below thick micromechanical function layer 20. As a result, it is therefore possible to provide an improved torsional stiffness of torsion spring 22.

This is ultimately achieved in that one end of torsion spring 22 is connected to a part of spring device 23, 24 that is developed essentially above micromechanical function layer 20, and another end of torsion spring 22 is connected to a part of spring device 23, 24 that is developed below micromechanical function layer 20.

In an advantageous manner, the provided micromechanical z-inertial sensor may be used for all types of z-acceleration sensors, and adhesion effects in z-acceleration sensors in the presence of transverse loading, in particular, are able to be avoided to a large extent.

Figure 5:
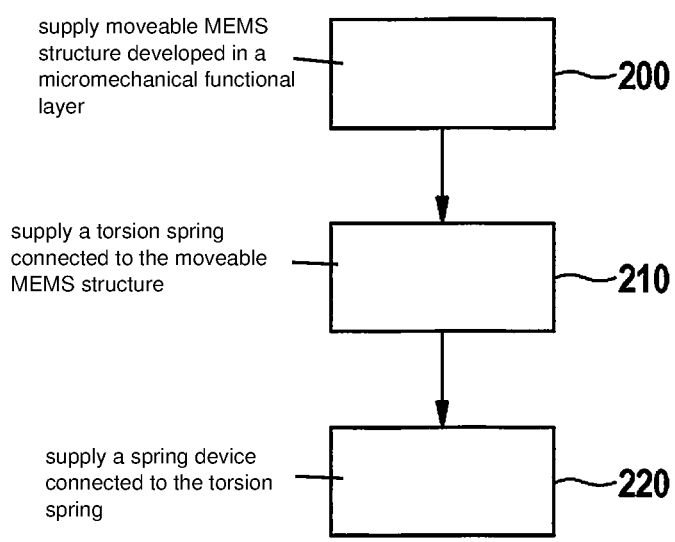
FIG. 5 shows a basic sequence of a method for producing a provided micromechanical z-inertial sensor.

FIG. 5 shows a basic sequence of the provided method for producing a micromechanical z-inertial sensor 100:

In a step 200, a supply of a movable MEMS structure 21, which is developed in a micromechanical function layer 20, is implemented.

In a step 210, a supply of a torsion spring 22. which is connected to the movable MEMS structure, is implemented.

In a step 220, a supply of a spring device 23, 24 connected to torsion spring 22 is implemented in such a way that a deflection of torsion spring 22 orthogonal to a sensing direction of MEMS structure 21 is able to be hampered in a defined manner.

Although the present invention has been described on the basis of specific exemplary embodiments herein, one skilled in the art will also be able to realize specific embodiments that are not disclosed or that are only partially disclosed without departing from the core of the present invention.

What is claimed is:

1. A z-inertial sensor, comprising:
a movable structure developed in a function layer;
a torsion spring connected to the movable structure; and
a spring device connected to the torsion spring, the spring device being developed to hamper a deflection of the torsion spring orthogonal to a sensing direction of the structure in a defined manner.

2. The z-inertial sensor as recited in claim 1, wherein a height of the spring device amounts to approximately one-third to approximately one-tenth of a height of the torsion spring.

3. The z-inertial sensor as recited in claim 1, wherein the spring device is attached to a substrate.

4. The z-inertial sensor as recited in claim 3, wherein the spring device is developed in a layer that is developed between the substrate and the function layer.

5. The z-inertial sensor as recited in claim 1, wherein the spring device is at least partly situated below the movable structure.

6. The z-inertial sensor as recited in claim 1, wherein the spring device is at least partly developed above the function layer.

7. The z-inertial sensor as recited claim 1, wherein one end of the torsion spring is connected to a part of the spring device that is developed above the function layer, and another part of the torsion spring is connected to a part of the spring device that is developed below the function layer.

8. The z-inertial sensor as recited in claim 1, wherein the spring device has sections that have an orthogonal alignment with respect to one another.

9. The z-inertial sensor as recited in claim 8, wherein at least one element of the spring device has a reinforcement structure.

10. A method for producing a z-inertial sensor, comprising:
providing a movable structure developed in a function layer;
providing a torsion spring connected to the movable structure; and
providing a spring device connected to the torsion spring in such a way that a deflection of the torsion spring orthogonal to a sensing direction of the structure is able to be hampered in a defined manner.

* * * * *